(12) United States Patent
Suenaga et al.

(10) Patent No.: US 6,427,462 B1
(45) Date of Patent: Aug. 6, 2002

(54) SEMICONDUCTOR MANUFACTURING FACILITY, SEMICONDUCTOR MANUFACTURING APPARATUS AND SEMICONDUCTOR MANUFACTURING METHOD

(75) Inventors: Osamu Suenaga, Koufu; Tadahiro Ohmi, Sendai; Sadao Kobayashi, Yokohama, all of (JP)

(73) Assignees: Tokyo Electron Limited, Tokyo; Tadihiro OHMI, Miyagi; Taisei Corporation, Tokyo, all of (JP)

( * ) Notice: Subject to any disclaimer, the term of this patent is extended or adjusted under 35 U.S.C. 154(b) by 0 days.

(21) Appl. No.: 09/669,908

(22) Filed: Sep. 27, 2000

Related U.S. Application Data

(63) Continuation of application No. PCT/JP00/04313, filed on Jun. 29, 2000.

(30) Foreign Application Priority Data

Jul. 2, 1999 (JP) .......................................... 11-189733

(51) Int. Cl.$^7$ .............................. F27D 9/00; F28F 3/12
(52) U.S. Cl. ........................... 62/185; 62/201; 165/169; 219/390; 373/113
(58) Field of Search .................. 62/201, 185; 219/390; 392/416; 373/113; 165/80, 4, 168, 169; 118/724

(56) References Cited

U.S. PATENT DOCUMENTS

| | | | | |
|---|---|---|---|---|
| 5,555,928 A | * | 9/1996 | Imaba et al. | ............ 165/169 X |
| 5,765,360 A | * | 6/1998 | Schmidt et al. | ......... 165/169 X |
| 5,894,887 A | * | 4/1999 | Kelsey et al. | ....... 165/104.26 X |

FOREIGN PATENT DOCUMENTS

| | | |
|---|---|---|
| JP | 4-073570 | 3/1992 |
| JP | 7-24295 | 1/1995 |
| JP | 7-284675 | 10/1995 |
| JP | 9-251959 | 9/1997 |
| JP | 3061067 | 6/1999 |

\* cited by examiner

*Primary Examiner*—William Wayner
(74) *Attorney, Agent, or Firm*—Pillsbury Winthrop LLP

(57) ABSTRACT

A heat generating part (1) of semiconductor manufacturing equipment is cooled by cooling water. An inner fluid passage (21) having an inlet port (31) of the cooling water on a vertically lower portion thereof is formed so as to surround a periphery of the heat generating part (1). An outer fluid passage (22) having an outlet port (32) of the cooling water on a vertically upper portion thereof is formed so as to surround a periphery of the inner fluid passage (21) and be capable of exchanging heat with the cooling water in the inner fluid passage. A communication passage (24) is provided to connect a vertically upper portion of said inner fluid passage and a vertically lower portion of said outer fluid passage. The cooling water flowing out of the outlet port (32) of the outer fluid passage (22) is supplied to the inlet port (31) of the inner fluid passage (21).

17 Claims, 15 Drawing Sheets

FIG.10

| SORTING | ITEM | EXAMPLE OF PRESETN INVENTION(FIG.7) | COMPARATIVE EXAMPLE(FIG.13) |
|---|---|---|---|
| COOLING WATER | FLOW CONTROL METHOD | CONTROL APPARATUS OUTLET TEMPERATURE TO 23°C | INLET TEMPERATUR IS CONSTANT, OUTLET TEMPERATURE AS RESULT |
| | KIND OF PUMP | VARIABLE FLOW PUMP EQUIPED WITH INVERTER | CONSTANT FLOW PUMP |
| | COLD WATER TANK TEMP. | 8 | 20 |
| | FLOW | FLUCTUATE BY TEMPERATURE LOAD | CONSTANT AT MAXIMUM PUMP CAPACITY |
| | AVERAG FLOW | 252 | 900 |
| COOLING METHOD OF APPARATUS | TYPE | DOUBLE JACKET SYSTEM | SINGLE COIL SYSTEM |
| | INLET TEMP.(°C) | 8 | 20 |
| | OUTLET TEMP.(°C) | 23 | FLUCTUATE(DESIGNED TO MAXIMUM, 26°C IN A MOMENT) |
| POWER CONSAMPTION | (kw/day) | 252 | 720 |
| MICRO VIBRATION OF PIPE | MEASURING METHOD | EXTREMELY SAMLL | VIBRATION PRESENT |

SEMICONDUCTOR MANUFACTURING FACILITY, SEMICONDUCTOR MANUFACTURING APPARATUS AND SEMICONDUCTOR MANUFACTURING METHOD

This is a Continuation of International Appln. No. PCT/JP00/4313 filed Jun. 29, 2000.

TECHNICAL FIELD

The present invention relates to semiconductor manufacturing facilities, semiconductor manufacturing apparatuses and a semiconductor manufacturing method and, more particularly, to a semiconductor manufacturing facility which recover heat emitted from semiconductor manufacturing equipment installed in a clean room and a semiconductor manufacturing apparatus used in such a semiconductor manufacturing facility and a semiconductor manufacturing method performed by such a semiconductor manufacturing facility.

BACKGROUND ART

Some semiconductor manufacturing equipments are provided with a heat source. For example, a heating furnace is provided in a vertical heat treatment apparatus, which performs a heat treatment on semiconductor wafers supported by a support tool in a shelf-like arrangement. The outer surface of such a heating furnace reaches a high temperature of about several hundred degrees, and if the heating furnace is laid in a bare room, a heat is emitted from the heating furnace to the surrounding area, which may exert a bad influence on apparatuses in the surrounding area. Additionally, in a case in which an operator touches the heating furnace by mistake, the operator may receive a burn.

Accordingly, it is necessary to cool the outer surface of the heating furnace, which is a heat source. FIG. 1A is a perspective view of a coil-type cooling pipe 10, which is conventionally used to cool a heating furnace, which is a heat source, and FIG. 1B is a front view of the coil-type cooling pipe 10. The cooling pipe 10 is wound on the periphery of the heating furnace, and cooling water is supplied to a lower cooling water inlet port 11 and the cooling water flows out through an upper cooling water outlet port 12. Release of heat to outside (inside the clean room) is suppressed by the cooling water absorbing the heat of the heat source.

The temperature of the cooling water supplied to the cooling water inlet port 11 is maintained at about 23° C., which is a setting temperature of a clean room so that dew formation does not occur. The temperature of the cooling water exiting from the cooling water outlet port 12 normally ranges from about 25° C. to 28° C. although the temperature varies according to the operating conditions. That is, a temperature difference between the inlet port 11 and the outlet port 12 is about 5° C. The reason for this is because if the temperature difference is large, the temperature difference influences the temperature distribution in the heat treatment atmosphere in the heating furnace, which lowers the process performance. Additionally, apparatus deterioration may be festinated in hardware. Further, it is undesired that a large temperature distribution is created in the clean room.

FIG. 2 is a structural diagram showing a supply and cooling system of the cooling water supplied to the coil-type cooling pipe 10. Cold water of about 6° C., which is cooled by a refrigerating machine 101 and stored in a cold-water tank 102, is delivered to a heat exchanger 103 so as to cool the cooling water for the coil-type cooling pipe 10, and the cold water is returned to the cold-water tank 102. On the other hand, the cooling water stored in a buffer tank 104, which has a temperature higher than 23° C., is delivered to the heat exchanger 103 by a water pump 105, and is cooled to the temperature of 23° C. by heat exchange with the cold water of 6° C. The cooling water enters the inlet port 11, passes through the cooling pipe 10 and exits from the outlet port 12 so as to be returned to the buffer tank 104. It should be noted that, in FIG. 2, 106 indicates a cooling tower, 107 indicates a temperature sensor, and 108–110 indicate water pumps.

In the above-mentioned cooling apparatus, the temperature of the cooling water supplied to the coil-type cooling pipe 10 must be set to the setting temperature of 23° C. of the clean room. Accordingly, the cooling water of the separate system must be controlled to about 23° C. by heat exchange by the heat exchanger 103 using the cold water of about 6° C. produced by the refrigerating machine 101. Accordingly, the refrigerating machine 101 and the heat exchanger 103 are needed, thereby increasing a thermal energy loss. Additionally, since there are two cooling water delivery lines, a water pump must be provided to each of the lines. As a result, there is a problem in that an area occupied by the facility is increased, and a facility equipment cost is increased.

In the above-mentioned cooling system, an amount Q of heat absorbed by the cooling water from the heat source is represented by the following equation (1), where amount of cooling water is W, specific heat is Cw, inlet temperature is Ti, outlet temperature is T0 and temperature difference between inlet and outlet is ΔT.

$$Q = W \cdot Cw \cdot (T0 - Ti) = W \cdot Cw \cdot \Delta T \qquad (1)$$

In the equation (1), since the specific heat Cw is constant, the amount W of cooling water must be increased so as to decrease the temperature difference ΔT to about 5° C. Accordingly, a large amount of cooling water is needed, and there is a problem in that a power cost of the pump is increased. Additionally, a micro vibration is generated due to an inevitable increase in the amount of cooling water flowing through a main water delivery pipe due to a large amount of cooling water flowing through the cooling pipe. The generated micro vibration propagates the building frame (structure) of the clean room, and consequently propagates an area in which an exposure machine and a scanning electron microscope which are sensitive to a vibration are installed, which exerts a bad influence on those equipment.

Further, since a constant amount of cooling water is supplied to the inlet port 11 of the cooing water coil 10, a large heat load is applied to the semiconductor manufacturing apparatus. The temperature of the outlet port 12 is increased when the temperature of the heat source is increased, and, on the contrary, an unnecessary cooing is made when the heat load is small. Accordingly, the heat load, which is used for the power to the water pump and producing unnecessary cooling water, is consumed, thereby increasing a loss of energy that is not efficiently used.

In addition to the above-mentioned problems, rust or corrosion occurs in the cooling pipe, the piping, the pump and the heat exchanger through which the cooling water flows, and it is one of the issues to prevent the rust or corrosion.

DISCLOSURE OF INVENTION

It is an object of the present invention to provide an improved and useful semiconductor manufacturing facility in which the above-mentioned problems are eliminated.

A more specific object of the present invention is to provide a semiconductor manufacturing facility and a semiconductor manufacturing apparatus having a cooling apparatus which has a small scale and is capable of reducing an amount of cooling water.

In order to achieve the above-mentioned objects, there is provided according to one aspect of the present invention a semiconductor manufacturing facility provided with semiconductor manufacturing equipment which generates heat during operation and a cooling apparatus for cooling a heat generating part of the semiconductor manufacturing equipment, the cooling apparatus comprising:
- an inner fluid passage formed so as to surround a periphery of the heat generating part and having an inlet port of cooling water on a vertically lower portion thereof;
- an outer fluid passage communicated with the inner fluid passage and having an outlet port of the cooling water on a vertically upper portion thereof, the outer fluid passage being formed so as to surround a periphery of the inner fluid passage and is capable of exchanging heat with the cooling water in the inner fluid passage;
- a communication passage connecting a vertically upper portion of the inner fluid passage and a vertically lower portion of the outer fluid passage; and
- a cooling water supply facility which cools the cooling water flowing out of the outlet port of the outer fluid passage and supplies the cooling water to the inlet port of the inner fluid passage.

Additionally, there is provided according to another aspect of the present invention a semiconductor manufacturing facility provided with semiconductor manufacturing equipment generating heat during operation and a cooling apparatus for cooling a heat generating part of the semiconductor manufacturing equipment, the cooling apparatus comprising:
- an inner fluid passage formed so as to surround a periphery of the heat generating part and having an inlet port of cooling water on a vertically lower portion thereof;
- an outer fluid passage communicated with the inner fluid passage and having an outlet port of the cooling water on a vertically lower portion thereof, the outer fluid passage being formed so as to surround a periphery of the inner fluid passage and is capable of exchanging heat with the cooling water in the inner fluid passage;
- a communication passage connecting a vertically upper portion of the inner fluid passage and a vertically upper portion of the outer fluid passage; and
- a cooling water supply facility which cools the cooling water flowing out of the outlet port of the outer fluid passage and supplies the cooling water to the inlet port of the inner fluid passage.

As a specific operational example, an amount of flow of the cooling water is controlled so that a temperature of the cooling water at the inlet port of the inner fluid passage is set to a temperature lower than a temperature of air surrounding the semiconductor manufacturing equipment, and a temperature of the cooling water at the outlet port of the outer fluid passage is set to be equal to a temperature of an environmental in which the semiconductor manufacturing equipment is placed.

According to the present invention, there is no possibility of dew formation even if the temperature of the cooling water at the inlet port is set to a temperature considerably lower than the temperature of the environment in which the semiconductor manufacturing equipment is placed since the inner fluid passage is located between the outer fluid passage and the heat generating part. Additionally, if the temperature difference between the cooling water at the inlet port and the cooling water at the outlet port is large, the temperature difference is shared by the inner fluid passage and the outer fluid passage, resulting in not so large temperature difference between one end and the other end of the inner fluid passage which surrounds the heat generating part. Accordingly, since the temperature difference between the temperature of the cooling water to be supplied and the temperature of the cooling water to be exhausted can be large, the cooling facility can be simplified by reducing the cooling area and an amount of the cooling water can be decreased. Further, a micro vibration of the pipe system and the inner fluid passage and the outer fluid passage can be suppressed, the process of the semiconductor manufacturing equipment is prevented from having a bad influenced.

In the present invention, the cooling water supply facility may include a refrigerating machine, and cold water produced by the refrigerating machine may be used as the cooling water supplied to the inlet port of the inner fluid passage. Additionally, the cooling water supply facility may include a refrigerating machine and a heat exchanger, and the cooling water supplied to the inlet port of the inner fluid passage may be cooled by the heat exchanger, which exchanges heat with cold water produced by said refrigerating machine.

Further, in the present invention the cooling water supply facility may comprise: a flow control part controlling an amount of flow of the cooling water supplied to the inlet port of the inner fluid passage; a temperature detecting part detecting a temperature of the cooling water at the outlet port of the outer fluid passage; and a control part controlling an amount of delivery of the cooling water via the flow control part based on a temperature detection value detected by the temperature detecting part so that the temperature of the cooling water of the outlet port of the outer fluid passage becomes a setting temperature. Alternatively, the cooling water supply facility may comprise: a bypass fluid passage connecting between the inlet port of the inner fluid passage and the outlet port of the outer fluid passage; a flow control part provided to the bypass fluid passage; a temperature detecting part detecting a temperature of the cooling water at the outlet port of the outer fluid passage; and a control part controlling an amount of delivery of the cooling water via the flow control part based on a temperature detection value detected by the temperature detecting part so that the temperature of the cooling water of the outlet port of said outer fluid passage becomes a setting temperature.

In the present invention, it is preferred to b a structure provided with deoxidizing means for removing dissolved oxygen in the cooling water supplied to the inlet port of the inner fluid passage; and reducing agent dissolving means for dissolving reducing agent in the cooling water. According to this, a metal constituting the fluid passage through which the cooling water passes is no oxidized, and formation of pinholes due to corrosion can be prevented since the cooling water has a reducing action. In this case, for example, the deoxidizing means and the reducing agent dissolving means may be means for supplying a mixture gas of a deoxidizing gas and a reducing gas into the cooling water by bubbling. Additionally, the cooling water may be stored in a hermetically sealed tank, and the deoxidizing means may be depressurizing means for depressurizing a gas phase part in the tank and the reducing agent dissolving means may supply a reducing gas to the depressurized gas phase part. The reducing agent may be hydrogen, and the hydrogen may be dissolved in the cooling water supplied to the inlet port of the inner fluid passage, a concentration of the hydrogen is preferably equal to or greater than 0.4 ppm and equal to or less than a saturated solubility. Additionally, it is preferred that a heat insulator be provided on an outer surface of a fluid passage part through which the cooling water flows, the heat insulator material being made of a material which does not generate a gaseous contaminant.

It should be noted that there is provided according to another aspect of the present invention a semiconductor manufacturing apparatus provided with the above-mentioned cooling apparatus. Additionally, there is provided according to yet another aspect of the present invention a semiconductor manufacturing method performed in the above-mentioned semiconductor manufacturing facility provided with the cooling apparatus.

BRIEF DESCRIPTION OF THE DRAWINGS

FIG. 10 is a chart showing a result of comparison between the embodiment of the present invention and a comparative example.

BEST MODE FOR CARRYING OUT THE INVENTION

A description will now be given, with reference to the drawings, of a semiconductor manufacturing facility according to a first embodiment of the present invention.

Figure 3A:
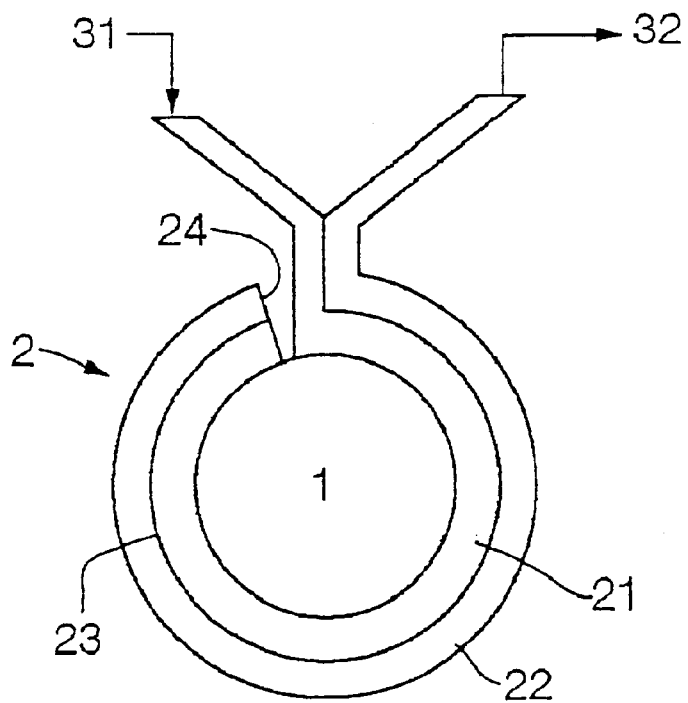
FIG. 3A is a conceptual illustration showing a double jacket cooling unit used in a semiconductor manufacturing facility according to a first embodiment of the present invention.
Figure 3B:
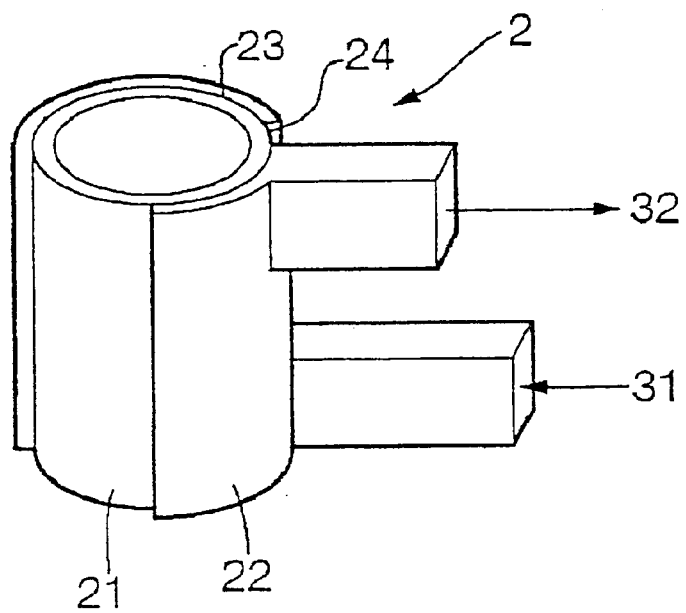
FIG. 3B is a perspective view of the double jacket cooling unit.

FIG. 3A is a conceptual illustration of a double jacket cooling unit as a cooling apparatus used for the semiconductor manufacturing facility according the first embodiment of the present invention, and FIG. 3B is an illustrative perspective view of the double jacket cooling unit. The double jacket cooling unit 2 shown in FIGS. 3A and 3B has an inner fluid passage 21 and an outer fluid passage 22 formed so as to surround a periphery of the inner fluid passage 21, the inner fluid passage being formed so as to surround a heat generating part 1 (refer to FIG. 9), which comprises a heating furnace of a vertical heat treatment apparatus. Each of the inner fluid passage 21 and the outer fluid passage 22 are formed as a ring-like fluid passage having a height corresponding to the heat generating part 1. The double jacket cooling apparatus is constituted by forming a separation plate, which separates the inner fluid passage 21 and the outer fluid passage from each other in a hollow ring-like member made of copper. That is, the double jacket cooling unit 2 according to the present embodiment is formed as annular passages extending in the vertical direction.

An inlet port 31 of cooling water is formed on a vertically lower portion of the inner fluid passage. A communication part 24, which connects the inner fluid passage 21 and the outer fluid passage 22 to each other, is provided at a furthest position in the inner fluid passage view from the inlet port 31. That is, in the present embodiment, the inner fluid passage 21 is formed approximately one turn along the periphery of the heat generating part 1 in a clockwise direction in FIG. 3A from a position, as a start point, at which the inlet port 31 is formed, and is connected to the outer fluid passage 22 immediately before returning said start point. The outer fluid passage 22 is formed over approximately one turn in a counterclockwise direction in FIG. 3A from the communicating part 24 as a start point, and an outlet port 32 of the cooling water is formed on a vertically upper portion of an end point. It should be noted that although the inlet port 31 and the outlet port 32 are openings of side surfaces of the inner fluid passage 21 and the outer fluid passage 22, respectively, the inlet port 31 and the outlet port 32 are illustrated as parts extending outward for the sake of convenience.

In the above-mentioned double jacket cooling unit 2, the cooling water flows in the inner fluid passage 21 from through the inlet port 31, and flows upward in the inner fluid passage 21 and reaches the communicating part 24. The cooling water is warmed by absorbing the heat of the heat generating part 1, which is in contact with the inner fluid passage 21, while flowing through the inner fluid passage 21. Then, the cooling water, which has passes through the inner fluid passage 21, flows in the outer fluid passage by passing through the communicating part 24. In the inner fluid passage 21, although the temperature of the cooling water tends to increase as it goes away from the inlet port 31, it is considered that parts having a higher temperature and a lower temperature are temporarily generated.

In the present embodiment, the communicating part 24 is a fluid passage communicating the upper portion of the inner fluid passage 21 and the lower portion of the outer fluid passage 22. Accordingly, the cooling water flows in the outer fluid passage through the lower portion thereof, and flows toward the outlet port 32 provided on the upper portion thereof. The cooling water, which flows in the outer fluid passage 22 through the communicating part 24, has already been warmed by being passed through the inner fluid passage 21, and it is considered that parts having a higher temperature and a lower temperature may be temporarily generated by receiving an influence of the temperature distribution of the cooling water in the inner fluid passage 21, which is in contact with the outer fluid passage 22. Since the inner fluid passage 21 and the outer fluid passage 22 are in contact with each other and an exchange of heat is made therebetween, the dispersion in the temperature of the inner fluid passage 21 is even out by the outer fluid passage 22 and the variation in the temperature of the outer fluid passage 21 is even out by the inner fluid passage 21. As a result, if, for example, the temperature of the communicating part 24 at the inlet port 31 is 6° C., the temperature at the outlet port 32 becomes 23° C. That is, the cooling water absorbs heat of the heat generating part 1 by the amount corresponding to the temperature difference. It should be noted that the temperature 32 of the outlet portion 32 can be controlled by adjusting the amount of cooling water. As indicated by the above-mentioned equation (1), since the temperature difference $\Delta T$ between the inlet port 31 and the outlet port 32 is as large as 17° C., for example, the amount W of the cooling water W can be small.

Ina case of a conventional single pipe coil, if $\Delta T$ is set as large as 17° C., the temperature difference (temperature difference in the vertical direction) between the upper portion and the lower portion of the heat generating part 1 is increased, and the temperature of the heat generating part 1 becomes uneven. Additionally, it is not preferable that a portion having a temperature higher than the setting temperature is generated in the clean room. However, since, in the present embodiment, the heat generating part 1 is in contact with the inner fluid passage 21, the temperature difference between the upper portion and the lower portion of the inner fluid passage 21, that is, the temperature difference between the inlet port 21 and the communicating part 24 is lower smaller than $\Delta T$ in the present embodiment, and, thus, the uniformity in the temperature of the heat generating part 1 does not deteriorate so much. Additionally, since the outer fluid passage 22 is present between the inner fluid passage 21 and the atmosphere in the clean room, there is no possibility that water in the clean room is condensed and the heat generating part 1 is wet even if the temperature (inlet temperature) of the cooling water flowing into the inner fluid passage 21 is set to a temperature as low as 6° C. Accordingly, since the cooling water having such a low temperature is supplied to the double jacket cooling unit 2, the outlet temperature can be set to a temperature close to the setting temperature of the clean room while $\Delta T$ is set to a large value.

Figure 4:
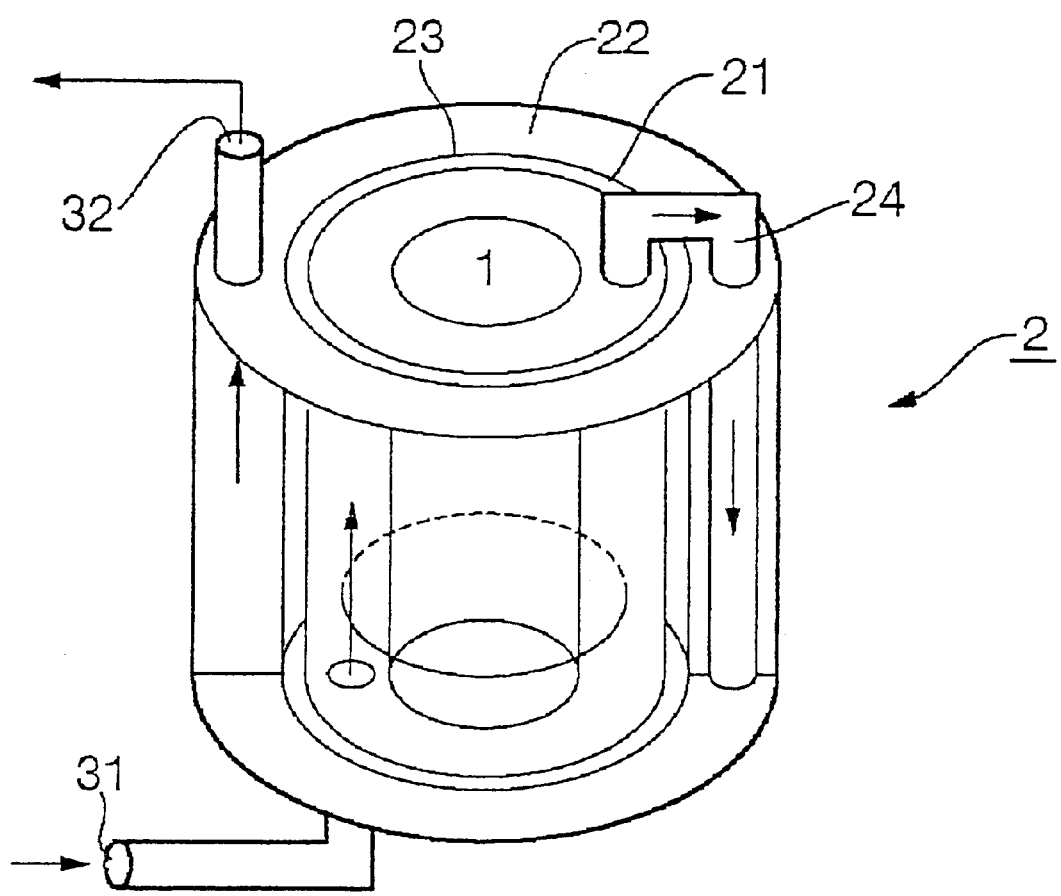
FIG. 4 is a perspective view showing an interior of the double jacket cooling unit.
Figure 5:
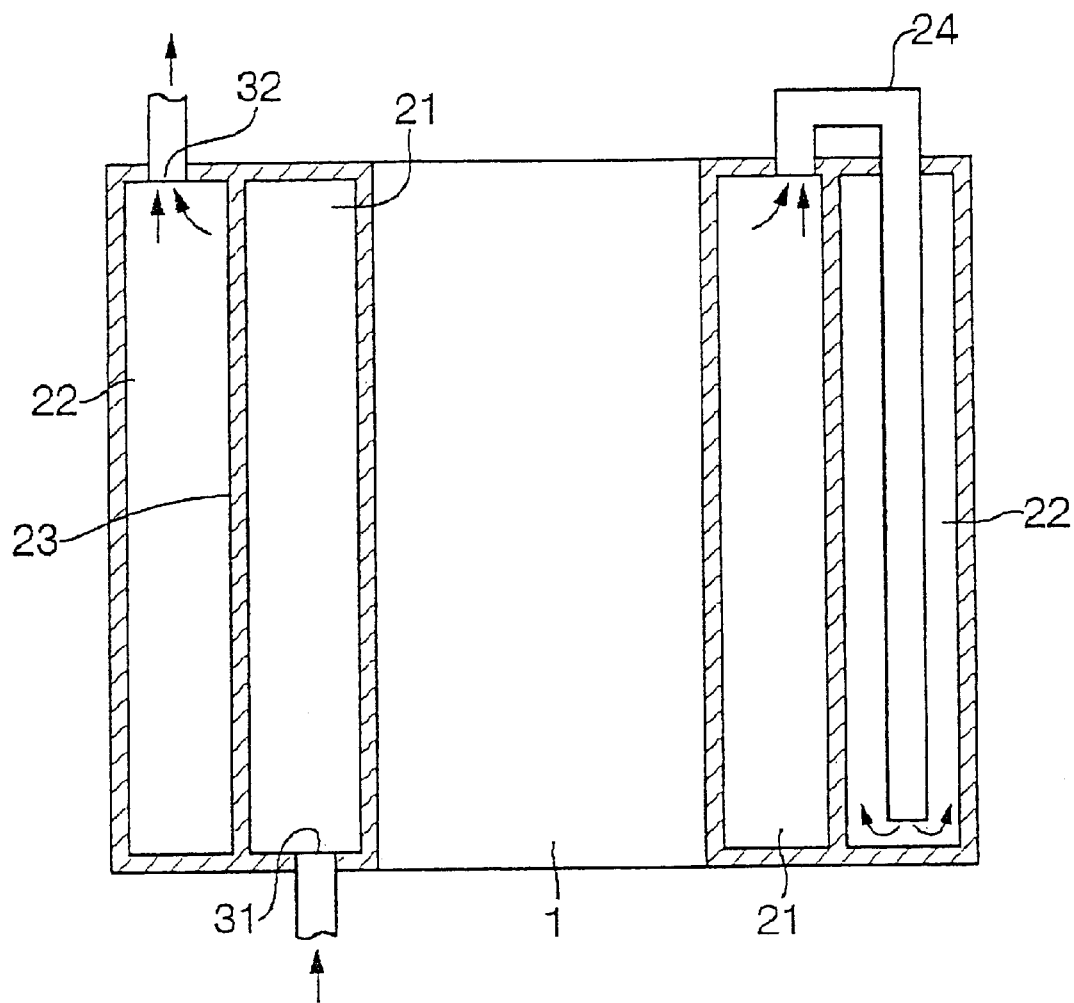
FIG. 5 is a cross-sectional view of the double jacket cooling unit.

A specific example of the above-mentioned double jacket cooling unit 2 is shown in FIGS. 4 and 5. In this example, it is the same as the example of FIGS. 3A and 3B that the inner fluid passage 21 and the outer fluid passage 22 are hollow ring-like members, however, the inlet port is formed on the bottom surface of the inner fluid passage 21 and the outlet port 32 is formed on the top surface of the outer fluid passage 22. The communicating part 24 is provided as a communicating pipe so as to deliver the cooling water from a position close to upper surface of the inner fluid passage 21 to a position close to the bottom surface of the outer fluid passage 22 at a position 180 degrees different from the inlet port 31 in the circumferential direction. Additionally, the outlet port 32 is provided at a position 180 degrees shifted from the communicating part 24 in the circumferential direction. Accordingly, the cooling water flows in the inlet port 31 evenly flows to the entire inner fluid passage 21 and enters the communicating par 24, and the cooling water entering via the communicating part 24 evenly flows in the entire outer fluid passage 22.

The communicating part 24 is preferably provided locally as in the example of FIGS. 3A through 5. That is, since the cooling water flows into the inner fluid passage 21 once spreads over its entirety, and, thereafter, a flow is formed to concentrate into the inlet of the narrow communicating part 24, the cooing water moves within the inner fluid passage 21 while moving in a large range, and, thereby, the uniformity in the temperature inside the inner fluid passage 21 is increased. Additionally, since the cooling water powerfully flows out of the narrow outlet of the communicating part 24 in the outer fluid passage 22 and spreads in the outer fluid passage 22, the uniformity in the temperature is also increased.

Figure 6:
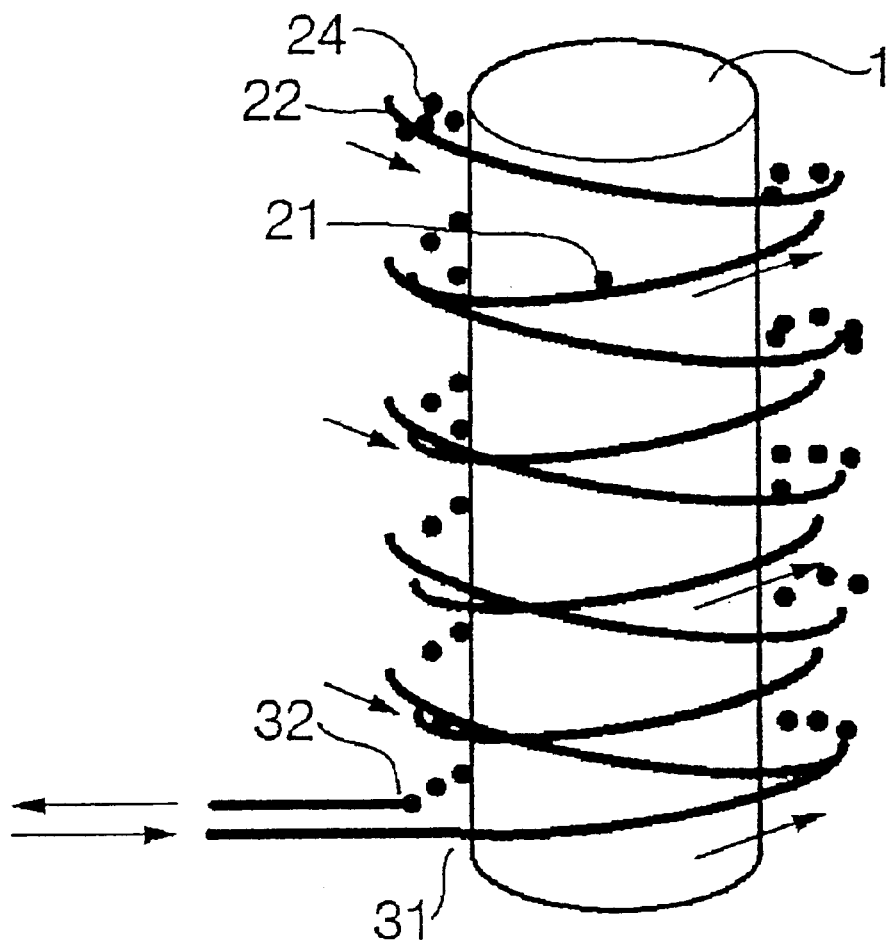
FIG. 6 is an illustration of a specific example of the double jacket cooling unit.

FIG. 6 is an illustration of another example of the double jacket cooling unit 2. In this example, the inner fluid passage 21 is formed in a coil-like shape along the outer surface of the heat generating part 1 upwardly from the inlet port 32 at the lower end thereof. The outer fluid passage 22 is continuous to the upper end of the inner fluid passage 21 and is formed as a coil-like shape on the outer surface of the inner fluid passage 21 extending downwardly, and the lower end thereof is the outlet port 32 of the cooling water. It should be noted that, in this example, the portion connecting the upper end of the inner fluid passage 21 to the outer fluid passage 22 corresponds to the communicating part 24.

Figure 7:
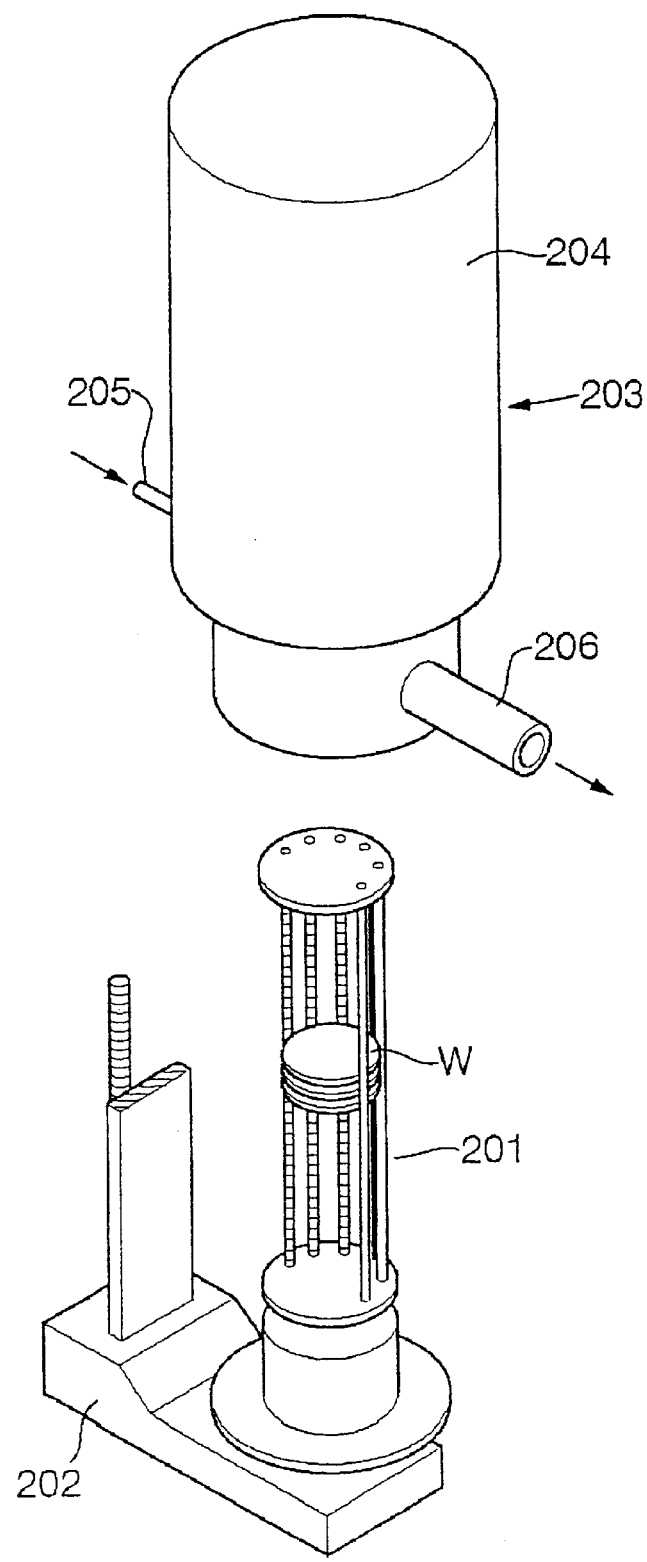

An outside view of a vertical heat treatment apparatus including a heating furnace, which is the heat generating part 1, is shown in FIG. 7. The vertical heat treatment apparatus performs a predetermined heat treatment by supporting a plurality of semiconductor wafers W on a support tool 201 referred to as a wafer boat and lifting the support tool 201 by a boat elevator 202 so as to carry the wafers in the heating furnace 203. The heating furnace 203 is constituted by arranging a heater and an insulator around a vertical reaction tube and covering by a cylindrical outer cover 204. In the figure, 205 and 206 indicate a process gas supply pipe and an exhaust pipe, respectively.

Figure 8:
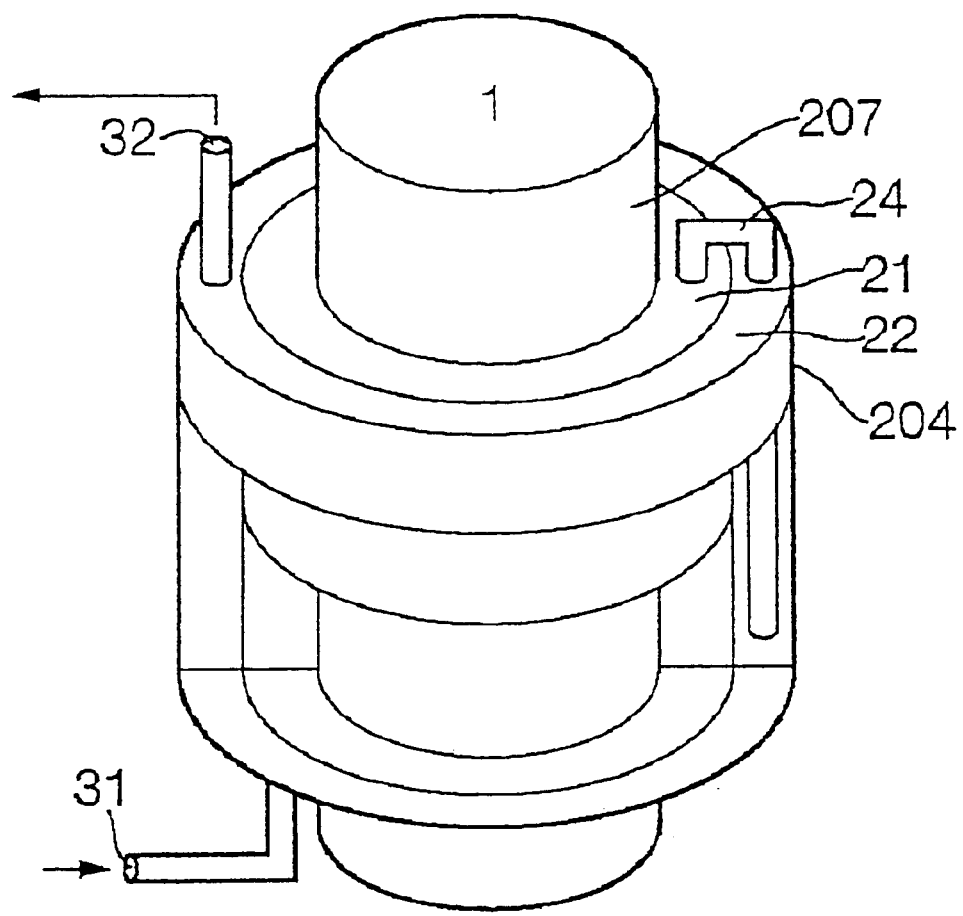
FIG. 8 is a perspective view of another example of the double jacket cooling unit.

Although the above-mentioned double jacket cooling unit 2 is provided outside the heating furnace 203 and the outer cover 204, the double jacket cooling unit 2 may be provided inside the outer cover 204 so as to be integrated with the heating furnace 203. In an example of FIG. 8, the double jacket cooling unit 2 is provided so as to surround an outer surface of an insulator 207, and the outer cover 204 is provided outside the double jacket cooling unit 2.

Figure 9:
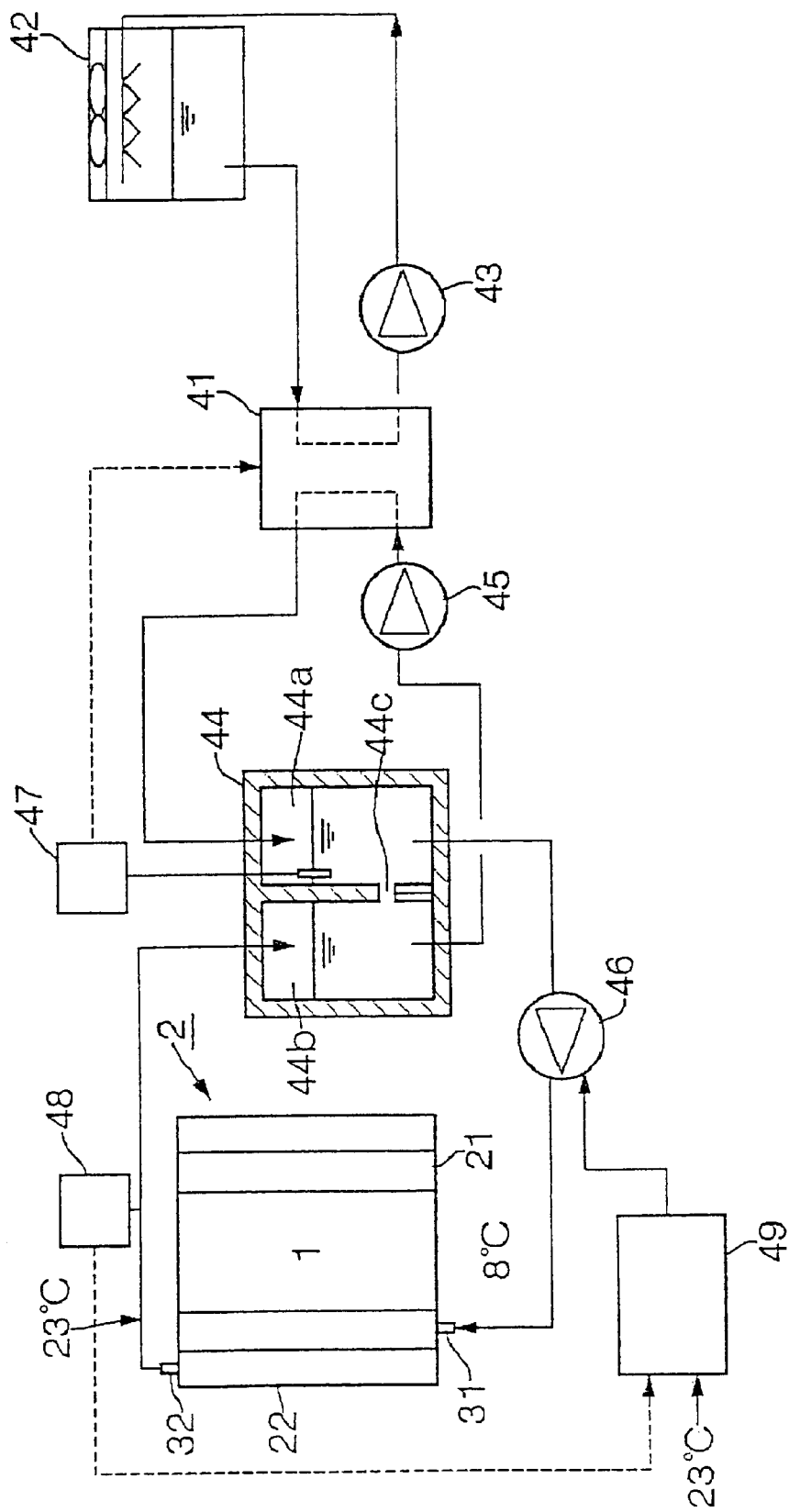
FIG. 9 is a structural diagram showing an entire structure of the semiconductor manufacturing facility according to the first embodiment of the present invention.

A description will now be given, with reference to FIG. 9, of an entire structure of the semiconductor manufacturing facility according to the first embodiment of the present invention. The cooling apparatus shown in FIG. 9 includes a cooling and supply system of the cooling water supplied to the double jacket cooling unit 2. In FIG. 9, cold water is supplied from the cooling tower 42 to the primary side of the refrigerating machine 41 by the water pump 43. The cooing water in a water tank 44 is supplied to the secondary side of the refrigerating machine 41. The refrigerating machine 41, the cooling tower 42 and the water pump 3 together constitute a cooling heat source.

The water tank 44 is divided into a first tank 44a and a second tank 44b by a separation wall. A water passage port 4c is formed on the separation wall so as to match the water levels of the first and second tanks to each other. The cooling water from the refrigerating machine 41 is delivered to the first tank 44a as a lower temperature cold water, and is supplied to the inlet port 31 of the double jacket cooling unit 2 by the water pump 46. The water pump 46 is constituted by attaching an inverter, which can control a revolution speed, to a motor driving the pump so that a flow can be controlled. The water temperature in the tank 44a is detected by a temperature detecting part 47, and the refrigerating machine 41 is controlled based on a temperature detection signal of the temperature detecting part 47 so that the temperature of the cooling water flowing in the secondary side is 8° C. for example.

Accordingly, the temperature of the cooling water supplied to the inlet port 31 of the double jacket cooling unit 2 is 8° C., and the temperature of the cooling water is increased while passing the inner fluid passage 21 and the outer fluid passage 22 of the double jacket cooling unit 2, and flows out of the outlet port 32 and delivered to the second tank 44b of the water tank 44. The temperature of the cooling water on the side of the outlet port 32 is detected by a temperature detecting part 48 and a temperature detection value is input to a control part 49. As for the temperature detecting parts 47 and 48, a thermo couple or a resistance sensor may be used.

The control part 49 controls a delivery amount (flow of delivered water) of water of the water pump 46 based on the temperature detection value and a previously set temperature, for example, 23° C., which is the setting temperature of the clean room, so that the difference between the signals becomes zero, that is, the temperature on the side of the outlet port 32 becomes 23° C. That is, when the temperature detection value of the temperature detecting part 48 is higher than 23° C., the delivered amount of the water pump 46 is increased by increasing the revolution speed of the motor by the inverter so as to decrease the temperature on the side of the outlet port 32. On the other hand, when said temperature detection value is lower than 23° C., the delivered amount of the water pump 46 is decreased by decreasing the revolution speed of the motor by the inverter so as to increase the temperature on the side of the outlet port 32.

As mentioned above, the temperature of the cooling water on the side of outlet port 32 is controlled to be 23° C. After cooling water delivered to the second tank 44b is delivered to the refrigerating machine 41 and is cooled to, for example, 8° C., the cooling eater returns to the first tank 44a. The flow control may be performed by using a DC motor instead of the motor equipped with the inverter. It should be noted that although the water pump 46 constitutes the flow control part, a constant flow pump may be used as the water control part, and a flow adjusting valve may be connected in parallel so as to adjust an opening degree of the flow adjusting valve based on the control signal of the control part 49.

In the above description, the cooling heat source system, the water pumps 45 and 46 and the water tank 44 correspond to the cooling water supply facility in the present embodiment.

In the description of the double jacket cooling unit 2, the construction was described in which the temperature difference ΔT between the inlet port 31 and the outlet port 32 can be increased, and a description will now be given of an effect obtained by such a structure in relation to the cooling water supply and cooling system. First, the cooling water having a temperature as low as, for example, 8° C. can be used since ΔT can be increased and there is no possibility of dew formation in the heat generating part 1 if the cooling water of a temperature lower than the setting temperature of the clean room is supplied since the cooling water of the low temperature flows through the inner fluid passage 21. Accordingly, the cold water from the refrigerating machine 41 can be supplied to the double jacket cooling unit 2 without decreasing the temperature of the cooling water to 20° C. by exchanging heat with the cold water from the refrigerating machine by the heat exchanger 103, which cooling water exits from a single tube coil as in the conventional arrangement. Although there is a demerit in that the facility is enlarged due to two water delivery lines being required if the heat exchanger 103 is used, there is no need to provide the heat exchanger 103, the buffer tank 104 and the water pump 105 in the conventional structure shown in FIG. 2, and, thereby, the number of facility equipments can be reduced resulting in simplification of the structure.

Additionally, since ΔT is large, the amount of the cooling water can be reduced and the power to the water pump can be reduced. Further, a micro vibration of the piping is reduced due to the small amount of the cooling water, and, thereby, the micro vibration propagating from the piping to the processing part via the heat generating part 1 can be reduced.

Further, in a case in which a thermal load during an operation of the semiconductor manufacturing equipment is rapidly increased and the temperature at the outlet port 32 tends to be rapidly increased, the temperature at the outlet port 32 does not rapidly increase since the temperature at the outlet port 32 is fed back so that the delivery amount of the water pump 46 is controlled to be increased. On the other hand, in a case in which the thermal load to the apparatus is small, the energy loss is small since the amount of the cooling water is reduced to match the energy loss.

The present invention includes a semiconductor manufacturing apparatus having the above-mentioned cooling apparatus.

Figure 1A:
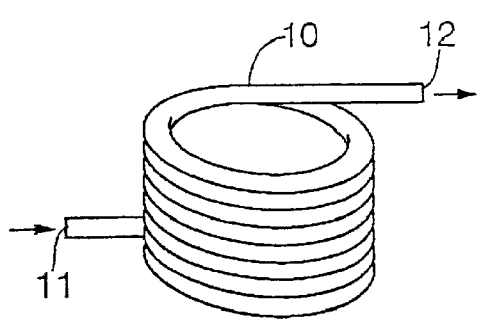
FIG. 1A is a perspective view of a coil-type cooling pipe used for a conventional cooling apparatus of semiconductor manufacturing equipment.
Figure 1B:
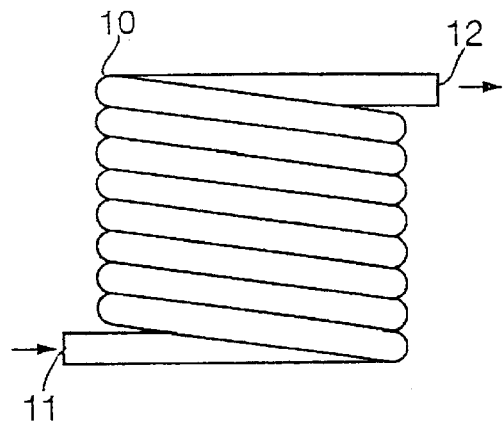
FIG. 1B is a front view of the oil-type cooling pipe shown in FIG. 1A.
Figure 2:
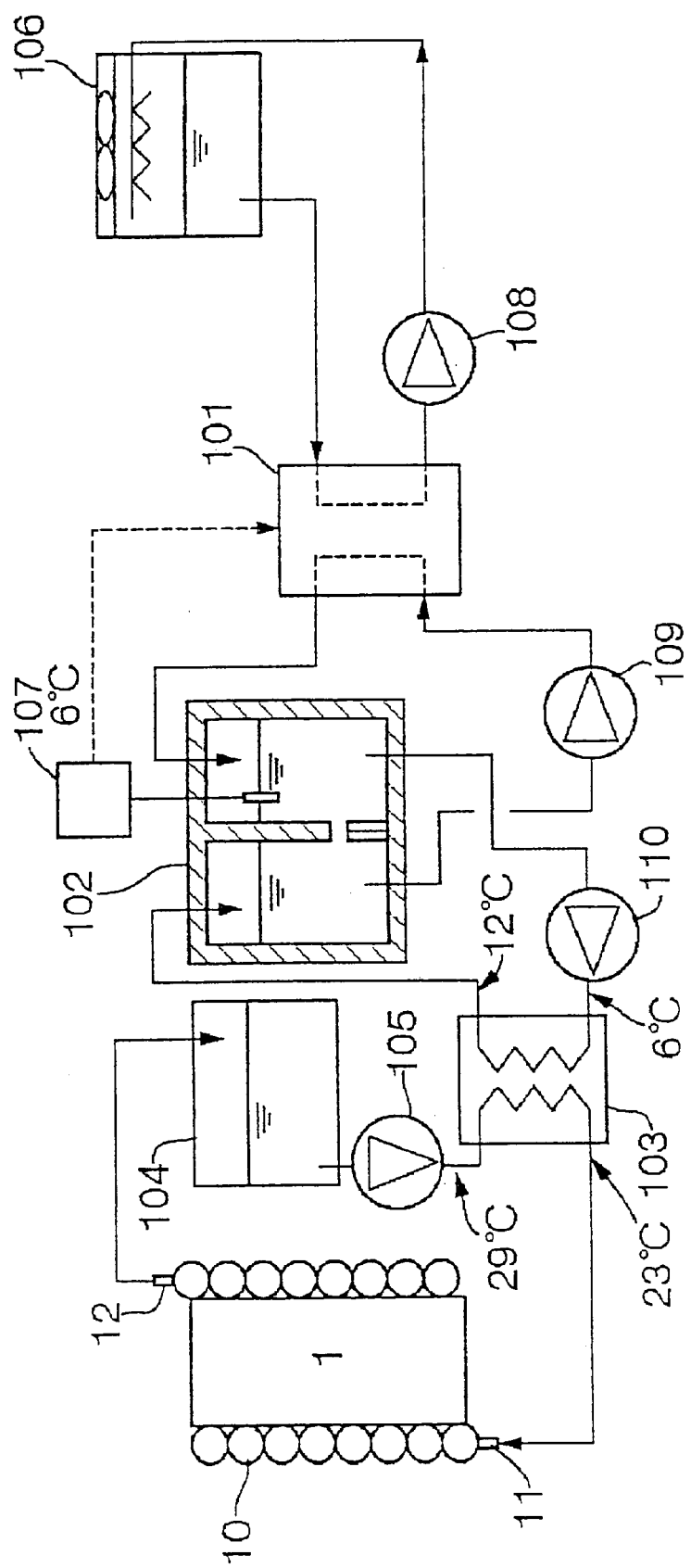
FIG. 2 is a structural diagram of the conventional cooling apparatus.

FIG. 10 shows a result of comparison between the semiconductor manufacturing facility (actual example) according to the first embodiment shown in FIG. 9 and the conventional semiconductor manufacturing facility (comparative example) shown in FIG. 2. The necessary average amount of flow of the cooling water was equal to or less than one third of that of the comparative example. The power consumption was little greater than that of the comparative example. It should be noted that the micro vibration of the piping system was reduced to 65% of that of the comparative example.

An insulator, which does not generate gaseous organic materials, was mounted to a low temperature side cooling water line, which is in contact with air in the clean room, and a protective film was wound on the insulator. The selection of the insulator and the tape was performed by the following method. The method is generally referred to as purge & trap gas chromatograph/mass spectrum (hereinafter abbreviated as P&T-GC/MS). First, specimen of several to tens of milligrams was filled in a test tube, and heated at 100° C. for 30 minutes under the flow of helium, and organic components generated is trapped by a trap tube, which was cooled at −130° C. After completion of heating of the specimen, the trapped organic components were rapidly heated at 300° C. under the flow of helium, and were analyzed by being introduced into the GC/MS apparatus. The GC apparatus was the HP-5890A type of Hewlett-Packard Co. (hereinafter abbreviated as HP), and the HP-5970B type mass analyzer was used for the MS apparatus. The column of the GC apparatus was HP-Ultra 2 (OV-5), which has an inner diameter of 0.2 mm, a length of 25 m and a film thickness of 0.33 µm. The measuring temperature condition was as follows.

initial temperature 40° C.→temperature up (10° C./min.)→final temperature 300° C. (maintain for 150 min.)

The carrier gas was helium, and a split method is used for the injecting method. The sprit ratio was 1/200. The ionizing method of MS was an electron bombardment method, and detection range was 25 to 1000 m/z.

A preferable limit of an amount of gaseous organic materials generated by an organic insulator, which can be used alone, is equal to or less than 50 $\mu$g/g-specimen. According to the research by the inventors, if the amount of gaseous organic materials generated is equal to or less than this value, the gaseous organic materials do not contaminate the air in the clean room. Further, the same thing happen in the amount of generation of organic materials from the protective tape to be used. In the present embodiment, polyethylene foam (analyzed value 27 $\mu$g/g-specimen) having a thickness of 20 mm was used, and a polyethylene tape (13 $\mu$g/g-specimen) was wound thereon.

Figure 11:
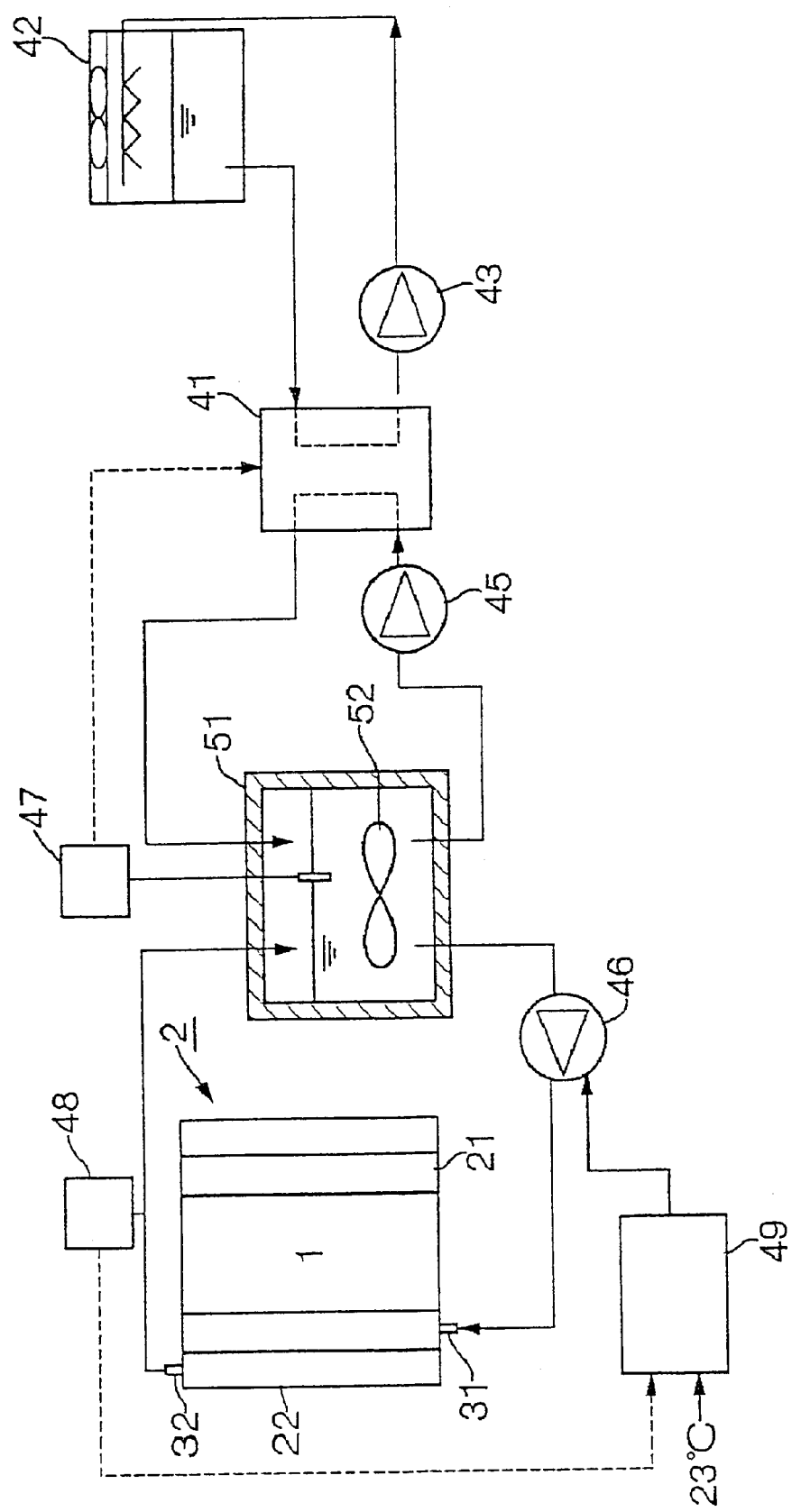
FIG. 11 is a structural diagram of a semiconductor manufacturing facility according to a second embodiment of the present invention.

FIG. 11 is a diagram showing an entire structure of a cooling apparatus according to a second embodiment of the present invention. In this example, a water tank 55, which does not have a separation wall but has an agitator 52, is provided instead of the tank 44 used in the cooling apparatus shown in FIG. 9. In the present embodiment, the cooling water of about 8° C. is obtained by agitating the cooling water (about 23° C.) returning from the double jacket cooling unit 2 and the cold water (about 6° C.) from the refrigerator 41. When the heat generating part 1 as cooled by the cooling apparatus shown in FIG. 11, it was able to reduce the amount of cooling water similar to the embodiment shown in the figure. Additionally, it was able to maintain the temperature of the cooling water at the outlet port 32 of the double jacket cooling water unit 2 to be substantially constant with respect to a fluctuation in the thermal load of the semiconductor manufacturing equipment. Further, it was able to reduce also a micro vibration.

Figure 12:
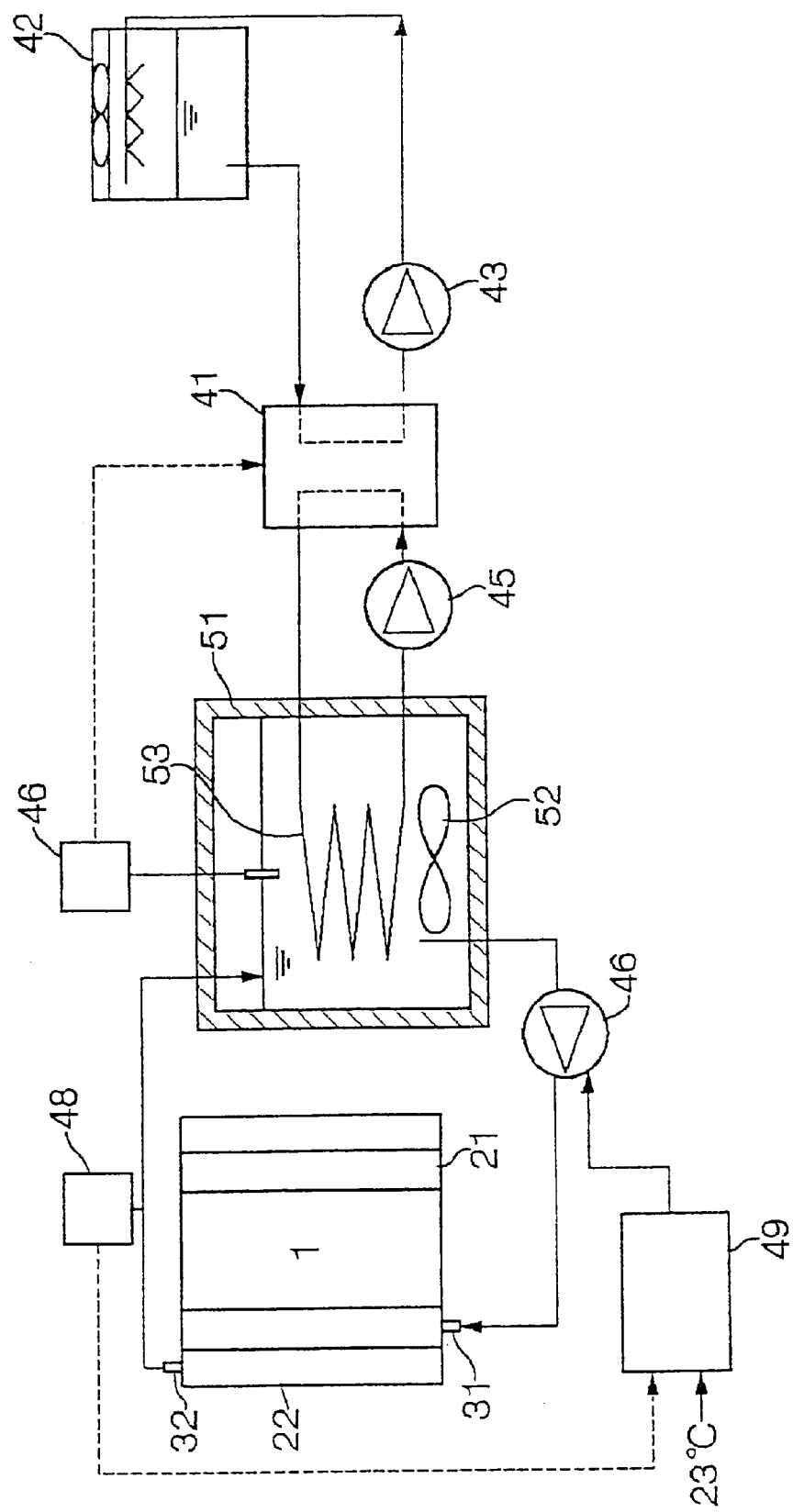
FIG. 12 is a structural diagram of a semiconductor manufacturing facility according to a third embodiment of the present invention.

FIG. 12 is a diagram of an entire structure of a semiconductor manufacturing facility according to a third embodiment of the present invention. In the present embodiment, a heat exchange coil 53 is provided in the water tank 51 instead of directly supplying the cold water from the refrigerating machine 41 to the water tank 51. Then, the cold water is delivered to coil 53 so as to cool the cooling water so that the temperature of the cooling water becomes, for example, 8° C. The present embodiment can also obtain the same effects as that of the first embodiment shown in FIG. 9.

Figure 13:
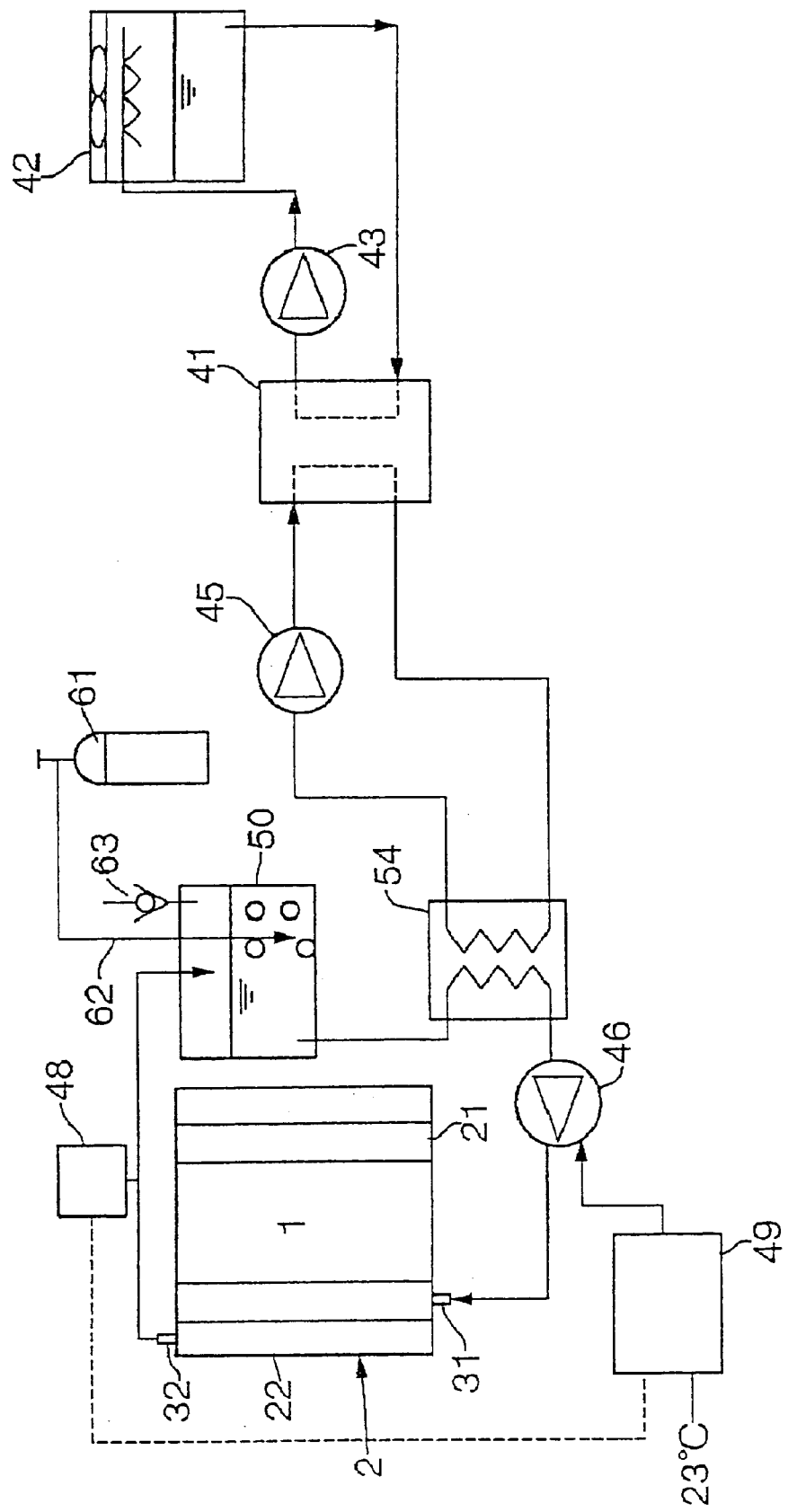
FIG. 13 is a structural diagram of a semiconductor manufacturing facility according to a fourth embodiment of the present invention.

FIG. 13 is a diagram of an entire structure of a semiconductor manufacturing facility according to a fourth embodiment of the present invention. In the present embodiment, the agitator 52 and the heat exchange coil 53 provided in the water tank 51 in the third embodiment are removed, and, instead, a heat exchanger 54 is installed outside the water tank. That is, the warmed cooling water stored in the water tank 50, which is a buffer tank, is subjected to a heat exchange with the cold water by the heat exchanger 54 so that the temperature of the cooling water becomes about 8° C., and the cooling water is delivered to the double jacket cooling unit 2 by the water pump 46.

Further, the present embodiment is arranged so that a mixture gas can be blown into the cooling water in the hermetically sealed water tank 50 from a gas supply source 61 through a gas blow nozzle 62, the mixture gas being a mixture of a deoxidizing gas such as nitrogen gas (N2 gas) and a reducing gas such as hydrogen gas (H2 gas) mixed by a volume ratio of 99:1. The gas blown into the cooling water and reached above the surface of the cooling water is exhausted through a release valve 63.

When the mixture gas is blown into the cooling water, the dissolved oxygen in the cooling water is removed (deoxidized), and further hydrogen dissolves in the cooling water. It should be noted that the gas supply source 61 and the nozzle 62 in the present embodiment commonly serve as deoxidizing means and reducing agent dissolving means. In the present embodiment, the effect the same as that of the first embodiment shown in FIG. 9 can be obtained.

A cooling operation was performed by using the cooling apparatus according to the present embodiment for a long time (about 12 months), and after the mixture gas had been blown into the cooling water in the water tank 51 for 30 minutes twice a day, formation of rust in the steel pipe (piping) of the cooling water system and the double jacket cooling unit was checked but no rust was found.

If the deoxidized cooling water, in which hydrogen is dissolved by a concentration equal to or greater than 0.4 ppm and equal to or less than saturated solubility at the temperature of use, is used, no rust is formed on inner surfaces of the piping system, the heat exchanger 54, the water pump 46 and double jacket cooling unit 2 through which the cooling water flows. Accordingly, generation of pinholes or pitting hole due to corrosion can be prevented. Although the mechanism that the cooling water according to the present embodiment can suppress the corrosion of a metal, which is in contact with the water of the cooling facility for the semiconductor manufacturing equipment, is not completely clear, the dissolved hydrogen having a reducing action is one of the reasons.

In the mechanism that the cooling water according to the present invention suppresses the corrosion of a metal, which is in contact with the water of the cooling facility for the semiconductor manufacturing equipment, the cooling water does not contain dissolved oxygen, and if the dissolved oxygen is present, the oxygen reducing potential becomes minus (−) 300 mV with respect to the potential of the hydrogen, which results in a reducing water. Accordingly, if the cooling water of the present invention in which hydrogen is dissolved by a concentration equal to or greater than 0.4 ppm and equal to or less than saturated solubility at the temperature of use, is used, formation of rust on inner surfaces of the piping system, the heat exchanger 54, the water pump 46 and double jacket cooling unit 2 through which the cooling water flows can be prevented. Accordingly, generation of pinholes or pitting hole due to corrosion can be prevented. The cooling water in the present embodiment can be applied to a usually used metal piping. Especially, the effect of a corrosion resistance and rust prevention with respect to a steel or copper piping for a cooling system is large.

On the other hand, air is dissolved in the cooling water, and, thus, oxygen is present in the cooling water. In such a case, the oxidation-reduction potential is plus (+) several hundreds mV, and the cooling water has an extremely strong oxidative action. According to experiments performed by the inventors, if water containing the dissolved oxygen is supplied to a cooling pipe or a heat exchanger made of steel or copper, iron and copper is oxidized by the oxygen, which results in formation of a rust. When the rust is generated and is attached to an interior of the cooling pipe or the heat exchanger, the heat transfer coefficient is reduced which results in reduction in the efficiency of heat exchange. Further, when the cooling water is used for the cooling pipe or the heat exchanger for a long time, corrosion is generated due to oxidation of the dissolved oxygen and a load to the water pump is increased due to a reduction in the water delivery cross section of the piping, which results in an increase in the power consumption of the water pump. Further, pinholes or corrosion pitting holes are formed on n inner surface of the cooling pipe or the heat exchanger. The generation of the pinholes may cause a leakage accident, it is necessary to completely prevent the formation of pinholes in a semiconductor manufacturing plant.

Accordingly, in the prior art, an attempt has been made to reduce corrosion by adjusting the pH value of the cooling water or adding an antioxidant to the cooling water. The copper made heat exchanger or cooling pipe having an excellent thermal conductivity cannot be used due to easy corrosion. Accordingly, it is necessary to use a material such as a stainless steel or a titanium alloy, which is less susceptible to corrosion.

However, in the present embodiment, the cooling water is deoxidized as mentioned above so as to prevent corrosion of the cooling pipe and the heat exchanger. As for the method of deoxidization, there is a method in which a mixture gas of a high-purity gas having a low oxygen concentration and a hydrogen gas into the cooling water in the tank (water tank) 50 as shown in FIG. 13 so as to remove the dissolved oxygen by aeration and dissolve the hydrogen gas in the cooling water. Additionally, there is a method in which the high-purity gas having a low oxygen concentration is introduced into the cooling water first so as to aerate the cooling water, and then a hydrogen gas is introduced into the cooling water so as to dissolve the hydrogen. According to the method shown in FIG. 13, the deoxidization and the dissolving of hydrogen are simultaneously achieved, and, thereby, the operation is simple and this method is particularly preferable.

The tank 50 is not necessarily hermetically sealed when the high-purity gas flows constantly. However, in a case in which the high-purity gas is introduced first so as to intermittently perform the aeration for deoxidization, the hermetically sealed tank is suitable. As for the high-purity gas having a low oxygen concentration, nitrogen (N2) gas having an oxygen concentration of equal to or less than 0.1 vol%. Alternatively, high-purity nitrogen (99.999% or more) may be used. Besides, a rare gas such as helium (He) gas may be used. By aerating those gasses in the cooling water in the tank, oxygen dissolved in the water is expelled into bubbles of the high-purity gas, thereby achieving deoxidization. When high-purity carbon dioxide (CO2) dissolves in water, the carbon dioxide acidify the water, thus, the acidified water is used after being neutralized by an alkaline material such as caustic soda As for the method of supplying hydrogen into water, hydrogen gas may be bubbled by a pipe put in the water or hydrogen may be merely supplied to an upper space in the tank in which space the water does not present. Hydrogen gas alone has a risk of catching a fire or an explosion, it is particularly preferable that a mixture hydrogen be used, which mixture hydrogen is diluted by nitrogen or the like to a concentration within an explosion limit.

Further, the water may be depressurized so as to remove dissolved oxygen, and, thereafter, hydrogen may be dissolved in the water. In such as case, it can be achieved by depressurizing a container storing the water to several tens mTorr. A for a facility to perform this method, a container, which can be hermetically sealed with water storing therein, must be provided with a depressurizing line for deoxidization and a hydrogen supply line. The tank must be a hermetically sealed container which can withstand the depressurization, and is provided with a deoxidization depressurizing line for deoxidizing the water in a state in which the water is stored in the tank and a hydrogen supply line for dissolving hydrogen in the deoxidized cooling water more than 1.5 ppm. It should be noted that the reducing agent is a material, which is water soluble and can prevent oxidation of a pipe. Normally, an inorganic material such as hydrogen, sodium thiosulfate or metal may be used. Additionally, an organic material such as sodium oxalate, sodium ascorbate or isopropyl alcohol may be used. Those chemical compounds render the oxidation-reduction voltage of water to minus (−), and has a function to prevent oxidation of a metal.

Figure 14:
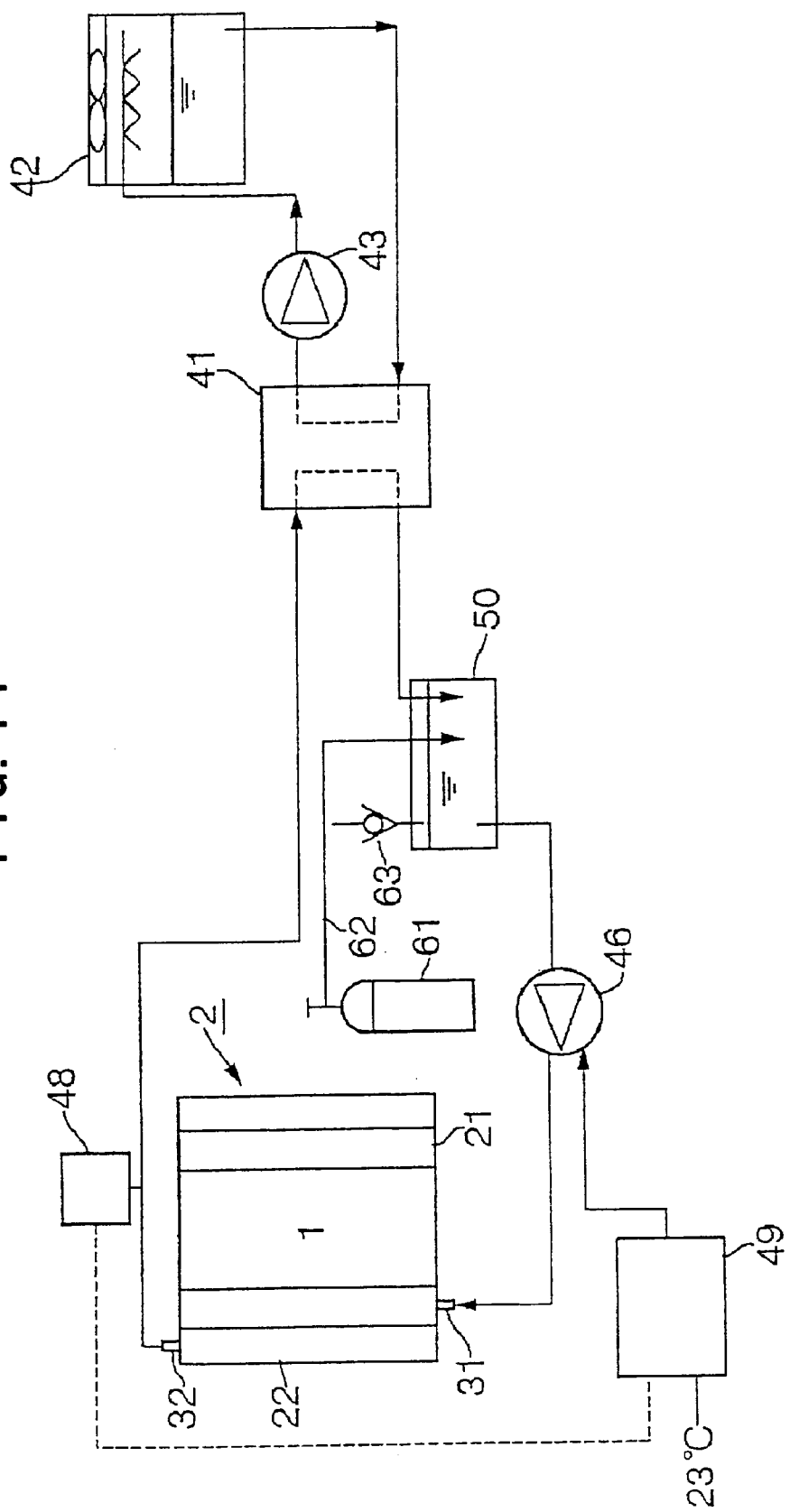
FIG. 14 is a structural diagram of a semiconductor manufacturing facility according to a fifth embodiment of the present invention.

FIG. 14 is a diagram showing an entire structure of a semiconductor manufacturing facility according to a fifth embodiment of the present invention. In the present embodiment, the cold water from the refrigerating machine 41 is temporarily stored in the water tank 50, and the called water is delivered as the cooling water to the double jacket cooling unit 2. Accordingly, the facility is further simplified than the above-mentioned embodiments. That is, the pump for the cooling water and the pump for the cooling system are achieved by a single pump, and the heat exchanger for the refrigerating machine for producing the cold water is used as the heat exchanger. Additionally, the water tank 50 is provided with hydrogen gas supply means so that the mixture gas of nitrogen 99 and hydrogen 1 can be introduced similar to the fourth embodiment. Also in the present embodiment, the effects the same as that of the first embodiment can be obtained.

A cooling operation was performed by using the cooling apparatus according to the present embodiment for a long time (about 12 months), and after the mixture gas had been blown into the cooling water in the water tank 50 for 30 minutes twice a day, formation of rust in the steel pipe (piping) of the cooling water system and the double jacket cooling unit was checked but no rust was found.

Figure 15:
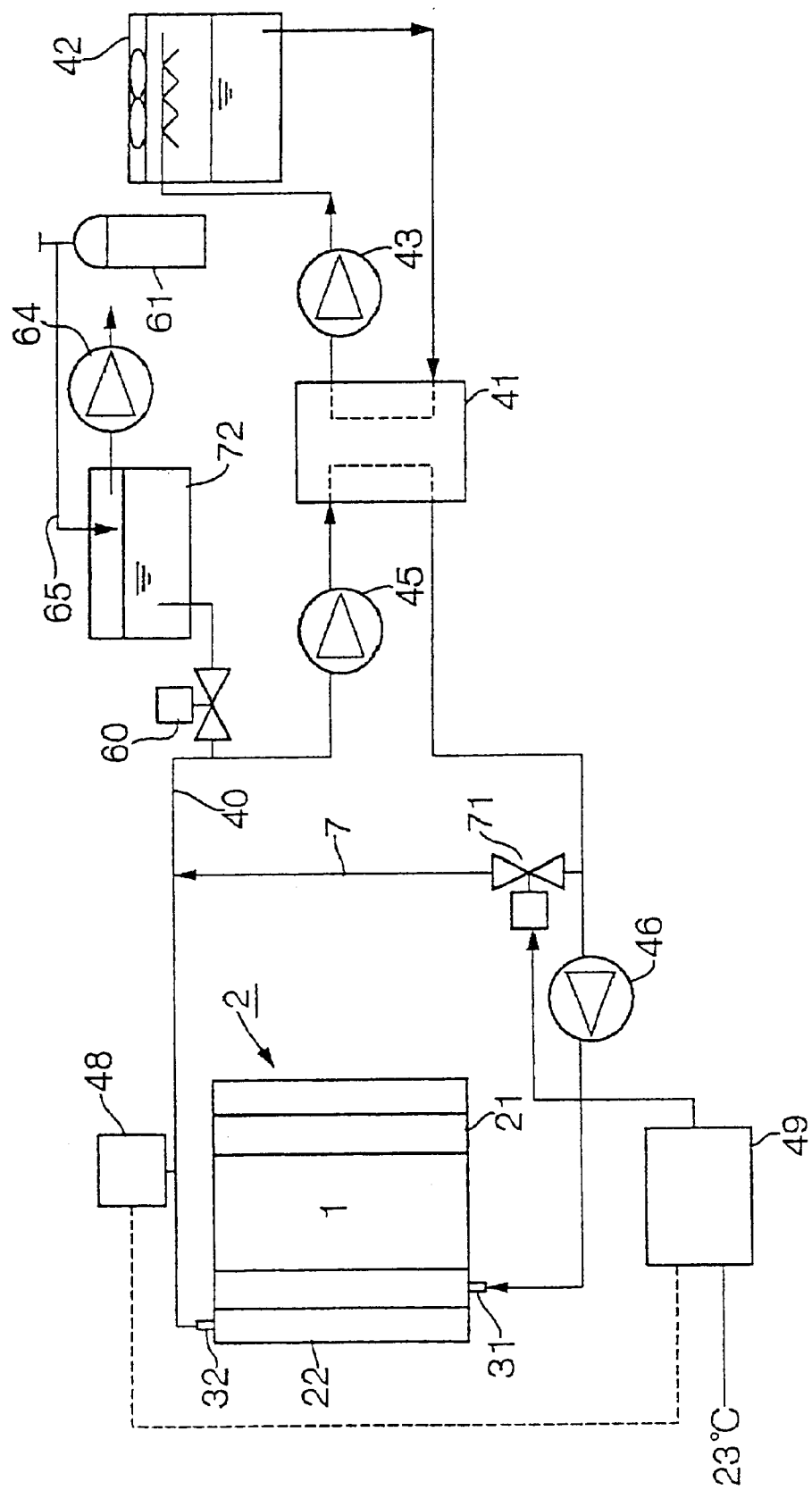
FIG. 15 is a structural diagram of a semiconductor manufacturing facility according to a sixth embodiment of the present invention.

FIG. 15 is a diagram showing an entire structure of a semiconductor manufacturing facility according to a sixth embodiment of the present invention. In the present embodiment, the heat exchanger of the refrigerating machine for producing the cold water is used as the heat exchanger, and a bypass fluid passage 7 is provided between the water pump 46 on the side of the inlet port 31 and the side of the outlet port 32 of the double jacket cooling unit 2. A flow adjusting valve 71 is provided on the bypass fluid passage 7. The temperature detection value of the temperature detecting part 48 and the temperature setting value (for example, 23° C.) are input to the control unit 49 so as to adjust the flow adjusting valve 71 by using a control signal corresponding to the difference between the temperature detection value and the temperature setting value. Thereby, the temperature at the outlet port 32 of the double jacket cooling unit 2 is controlled to be, for example, 23° C. That is, when the temperature at the outlet port 32 is high, an amount of cooling water delivered from the water pump 46 to the double jacket cooling unit 2 is increased by choking the flow adjusting valve 71 so as to decrease the temperature at the outlet port 32. On the other hand, when the temperature at the outlet port 32 is low, an amount of cooling water delivered from the water pump 46 to the double jacket cooling unit 2 is decreased by opening the flow adjusting valve 71 so as to increase the temperature at the outlet port 32. It should be noted that the temperature detecting part detects the temperature at the outlet port 32, but the detection of temperature at the outlet port may include detection of a temperature at a point on the downstream side of a junction between the line connected to the outlet port 32 and the bypass line 7.

A hermetically sealed cooling water supply tank 72 is connected to the inlet side of the water pump 45 via an opening and closing valve 60, the water pump 45 being provided on the circulating passage 40 which circulates the cooling water between the refrigerating machine 41 and the double jacket cooling unit 2. The cooling water is subjected to the deoxidizing and hydrogen dissolving process in the tank 72. A vacuum pump 64 is connected to the tank 72, and a gas supply pipe 65 provided with a gas supply source 61 on one end thereof is also connected to the tank 72. In this example, the vacuum pump constitutes a deoxidizing means, and the gas supply pipe constitutes a reducing agent dissolving means. When the cooling water is processed, the deoxidization is performed first by depressurizing the tank 72 by the vacuum pump to 20 mTorr and maintaining the pressure for 30 minutes. Subsequently, the above-mentioned mixture gas (hydrogen gas+nitrogen gas) is supplied from the gas supply source 61 to the tank 72 until the pressure becomes a normal pressure, and let two hours passed so as to dissolve hydrogen in the cooling water. In this case, the nitrogen gas serves as a carrier gas.

Thereafter, the opening and closing valve 60 is opened so as to deliver the cooling water in the tank 72 to the refrigerating machine 41 by the water pump 45 so as to cool the cooling water, and supplies the cooled cooling water to the double jacket cooling unit 2 by the water pump 46. Then, the opening and closing valve 60 is closed when a sufficient amount of the cooling water is supplied, and, thereafter, the supply of the cooling water is achieved by repeating the above-mentioned method.

According to the present embodiment, effects the same as that of the first embodiment shown in FIG. 9 were obtained with respect to the reduction in an amount of the cooling water, a temperature stability to the fluctuation in a load of the semiconductor manufacturing apparatus and the reduction in the micro vibration. Additionally, a cooing operation was performed for a long time (about 12 months) there is no rust found in the steel pipe of the cooling system and the double jacket cooling unit 2.

As mentioned above, according to the present invention, since the heat generating part is cooled by using the double jacket cooling unit, the temperature of the cooling water at the inlet port of the double jacket cooling unit can be much lowered than the setting temperature of the clean room, and, thereby, an attempt can be made to simplify the cooling facility. Since the temperature difference between the inlet port and the outlet port of the cooling water can be increased, the amount of cooling water can be reduced, which results in a less power consumption and a suppressed micro vibration. Additionally, since the cooling water is deoxidized and a reducing agent is dissolved in the cooling water, the cooling line is prevented from forming rust. Further, a portion at which the cooling water contacts air in the clean room is insulated by an insulator, which does not generate gaseous organic materials, and, thereby, insulated cooling can be achieved which results in prevention of dew formation and the air in the clean room can be prevented from being contaminated.

The present invention is not limited to the specifically disclosed embodiments, and variations and modifications may be made without departing from the scope of the present invention.

What is claimed is:

1. A semiconductor manufacturing facility provided with semiconductor manufacturing equipment generating heat during operation and a cooling apparatus (2) for cooling a heat generating part (1) of the semiconductor manufacturing equipment, said cooling apparatus (2) comprising:
an inner fluid passage (21) formed so as to surround a periphery of said heat generating part (1) and having an inlet port (31) of cooling water on a vertically lower portion thereof;
an outer fluid passage (22) communicated with the inner fluid passage (21) and having an outlet port (32) of the cooling water on a vertically upper portion thereof, the outer fluid passage being formed so as to surround a periphery of the inner fluid passage (21) and is capable of exchanging heat with the cooling water in the inner fluid passage;
a communication passage (24) connecting a vertically upper portion of said inner fluid passage and a vertically lower portion of said outer fluid passage; and
a cooling water supply facility which cools the cooling water flowing out of the outlet port (32) of said outer fluid passage (22) and supplies the cooling water to the inlet port (31) of the inner fluid passage (21).

2. A semiconductor manufacturing facility provided with semiconductor manufacturing equipment generating heat during operation and a cooling apparatus (2) for cooling a heat generating part (1) of the semiconductor manufacturing equipment, said cooling apparatus (2) comprising:
an inner fluid passage (21) formed so as to surround a periphery of said heat generating part (1) and having an inlet port (31) of cooling water on a vertically lower portion thereof;
an outer fluid passage (22) communicated with the inner fluid passage (21) and having an outlet port (32) of the cooling water on a vertically lower portion thereof, the outer fluid passage being formed so as to surround a periphery of the inner fluid passage (21) and is capable of exchanging heat with the cooling water in the inner fluid passage;
a communication passage (24) connecting a vertically upper portion of said inner fluid passage and a vertically upper portion of said outer fluid passage; and
a cooling water supply facility which cools the cooling water flowing out of the outlet port (32) of said outer fluid passage (22) and supplies the cooling water to the inlet port (31) of the inner fluid passage (21).

3. The semiconductor manufacturing facility as claimed in claim 1 or 2, characterized by further comprising flow control means (46, 49) for controlling the amount of flow of the cooling water so that a temperature of the cooling water at the inlet port (31) of said inner fluid passage (21) is set to a temperature lower than a temperature of air surrounding the semiconductor manufacturing equipment, and a temperature of the cooling water at the outlet port (32) of said outer fluid passage (22) is set to be equal to the temperature of the atmosphere of the semiconductor manufacturing equipment.

4. The semiconductor manufacturing facility as claimed in claim 1 or 2, characterized in that said cooling water supply facility includes a refrigerating machine (41), and the cooling water supplied to the inlet port (31) of said inner fluid passage (21) is cooled by said refrigerating machine (41).

5. The semiconductor manufacturing facility as claimed in claim 1 or 2, characterized in that said cooling water supply facility includes a refrigerating machine (41) and a heat exchanger, and the cooling water supplied to the inlet port (31) of said inner fluid passage (21) is cooled by the heat exchanger exchanging heat with cold water produced by said refrigerating machine (41).

6. The semiconductor manufacturing facility as claimed in claim 1 or 2, characterized in that said cooling water supply facility comprises:
- a flow control part (46) controlling an amount of flow of the cooling water supplied to the inlet port (31) of said inner fluid passage (21);
- a temperature detecting part (48) detecting a temperature of the cooling water at the outlet port (32) of said outer fluid passage (22); and
- a control part (49) controlling an amount of delivery of the cooling water via said flow control part (46) based on a temperature detection value detected by the temperature detecting part so that the temperature of the cooling water of the outlet port (32) of said outer fluid passage becomes a setting temperature.

7. The semiconductor manufacturing facility as claimed in claim 1 or 2, characterized in that said cooling water supply facility comprises:
- a bypass fluid passage (7) connecting between the inlet port (31) of said inner fluid passage (21) and the outlet port (32) of said outer fluid passage (22);
- a flow control part (71) provided to the bypass fluid passage;
- a temperature detecting part (48) detecting a temperature of the cooling water at the outlet port (32) of said outer fluid passage (22); and
- a control part (49) controlling an amount of delivery of the cooling water via said flow control part (71) based on a temperature detection value detected by the temperature detecting part (48) so that the temperature of the cooling water of the outlet port (32) of said outer fluid passage (22) becomes a setting temperature.

8. The semiconductor manufacturing facility as claimed in claim 1 or 2, characterized by further comprising:
- deoxidizing means (61, 62, 63) for removing dissolved oxygen in the cooling water supplied to the inlet port (31) of said inner fluid passage (21); and
- reducing agent dissolving means (61, 62, 63) for dissolving reducing agent in the cooling water.

9. The semiconductor manufacturing facility as claimed in claim 8, characterized in that said deoxidizing means and said reducing agent dissolving means (61, 62, 63) are means for supplying a mixture gas of a deoxidizing gas and a reducing gas into the cooling water by bubbling.

10. The semiconductor manufacturing facility as claimed in claim 8, characterized by further comprising a hermetically sealed tank (72) storing the cooling water, and said deoxidizing means is depressurizing means for depressurizing a gas phase part in the tank (72) and the reducing agent dissolving means (61, 65) supplies a reducing gas to the depressurized gas phase part.

11. The semiconductor manufacturing facility as claimed in claim 8, characterized in that the reducing agent is hydrogen.

12. The semiconductor manufacturing facility as claimed in claim 11, characterized in that hydrogen is dissolved in the cooling water supplied to the inlet port (31) of the inner fluid passage (21), a concentration of the hydrogen is equal to or greater than 0.4 ppm and equal to or less than a saturated solubility.

13. The semiconductor manufacturing facility as claimed in claim 1 or 2, characterized in that a heat insulator is provided on an outer surface of a fluid passage part through which the cooling water flows, the heat insulator material being made of a material which does not generate a gaseous contaminant.

14. A semiconductor manufacturing apparatus comprising:
- semiconductor manufacturing equipment generating heat having a heat generating part (1);
- an inner fluid passage (21) formed so as to surround a periphery of said heat generating part (1) and having an inlet port (31) of cooling water on a vertically lower portion thereof;
- an outer fluid passage (22) communicated with the inner fluid passage (21) and having an outlet port (32) of the cooling water on a vertically upper portion thereof, the outer fluid passage being formed so as to surround a periphery of the inner fluid passage (21) and is capable of exchanging heat with the cooling water in the inner fluid passage;
- a communication passage (24) connecting a vertically upper portion of said inner fluid passage and a vertically lower portion of said outer fluid passage; and
- a cooling water supply facility which cools the cooling water flowing out of the outlet port (32) of said outer fluid passage (22) and supplies the cooling water to the inlet port (31) of the inner fluid passage (21).

15. A semiconductor manufacturing apparatus comprising:
- semiconductor manufacturing equipment generating heat having a heat generating part (1);
- an inner fluid passage (21) formed so as to surround a periphery of said heat generating part (1) and having an inlet port (31) of cooling water on a vertically lower portion thereof;
- an outer fluid passage (22) communicated with the inner fluid passage (21) and having an outlet port (32) of the cooling water on a vertically lower portion thereof, the outer fluid passage being formed so as to surround a periphery of the inner fluid passage (21) and is capable of exchanging heat with the cooling water in the inner fluid passage;
- a communication passage (24) connecting a vertically upper portion of said inner fluid passage and a vertically upper portion of said outer fluid passage; and
- a cooling water supply facility which cools the cooling water flowing out of the outlet port (32) of said outer fluid passage (22) and supplies the cooling water to the inlet port (31) of the inner fluid passage (21).

16. A semiconductor manufacturing method for manufacturing a semiconductor by using a semiconductor manufacturing apparatus comprising:
- semiconductor manufacturing equipment generating heat having a heat generating part (1);
- an inner fluid passage (21) formed so as to surround a periphery of said heat generating part (1) and having an inlet port (31) of cooling water on a vertically lower portion thereof;
- an outer fluid passage (22) communicated with the inner fluid passage (21) and having an outlet port (32) of the cooling water on a vertically upper portion thereof, the outer fluid passage being formed so as to surround a periphery of the inner fluid passage (21) and is capable of exchanging heat with the cooling water in the inner fluid passage;
- a communication passage (24) connecting a vertically upper portion of said inner fluid passage and a vertically lower portion of said outer fluid passage; and
- a cooling water supply facility which cools the cooling water flowing out of the outlet port (32) of said outer fluid passage (22) and supplies the cooling water to the inlet port (31) of the inner fluid passage (21);

a flow control part (46) controlling an amount of flow of the cooling water supplied to the inlet port (31) of said inner fluid passage (21); and a temperature detecting part (48) detecting a temperature of the cooling water at the outlet port (32) of said outer fluid passage (22), the semiconductor manufacturing method characterized by comprising the step of processing the semiconductor while controlling an amount of delivery of the cooling water via said flow control part (46) based on a temperature detection value detected by the temperature detecting part (48) so that the temperature of the cooling water of the outlet port (32) of said outer fluid passage (22) becomes a setting temperature.

17. A semiconductor manufacturing method for manufacturing a semiconductor by using a semiconductor manufacturing apparatus comprising:

semiconductor manufacturing equipment generating heat having a heat generating part (1);

an inner fluid passage (21) formed so as to surround a periphery of said heat generating part (1) and having an inlet port (31) of cooling water on a vertically lower portion thereof;

an outer fluid passage (22) communicated with the inner fluid passage (21) and having an outlet port (32) of the cooling water on a vertically lower portion thereof, the outer fluid passage being formed so as to surround a periphery of the inner fluid passage (21) and is capable of exchanging heat with the cooling water in the inner fluid passage;

a communication passage (24) connecting a vertically upper portion of said inner fluid passage and a vertically upper portion of said outer fluid passage;

a cooling water supply facility which cools the cooling water flowing out of the outlet port (32) of said outer fluid passage (22) and supplies the cooling water to the inlet port (31) of the inner fluid passage (21);

a flow control part (46) controlling an amount of flow of the cooling water supplied to the inlet port (31) of said inner fluid passage (21); and a temperature detecting part (48) detecting a temperature of the cooling water at the outlet port (32) of said outer fluid passage (22), the semiconductor manufacturing method characterized by comprising the step of processing the semiconductor while controlling an amount of delivery of the cooling water via said flow control part (46) based on a temperature detection value detected by the temperature detecting part (48) so that the temperature of the cooling water of the outlet port (32) of said outer fluid passage (22) becomes a setting temperature.

* * * * *

UNITED STATES PATENT AND TRADEMARK OFFICE
CERTIFICATE OF CORRECTION

PATENT NO. : 6,427,462 B1
DATED : August 6, 2002
INVENTOR(S) : Suenaga et al.

It is certified that error appears in the above-identified patent and that said Letters Patent is hereby corrected as shown below:

<u>Title page,</u>
Item [73], Assignee, please correct the spelling of the 2$^{nd}$ Assignee's name to read:
-- Tadahiro OHMI --

Signed and Sealed this

Fifth Day of August, 2003

JAMES E. ROGAN
*Director of the United States Patent and Trademark Office*